United States Patent
Yagi (10) Patent No.: US 7,627,010 B2
(45) Date of Patent: Dec. 1, 2009

(54) SEMICONDUCTOR LASER HAVING FABRY-PEROT RESONATOR

(75) Inventor: Tetsuya Yagi, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 11/854,653

(22) Filed: Sep. 13, 2007

(65) Prior Publication Data

US 2008/0240198 A1 Oct. 2, 2008

(30) Foreign Application Priority Data

Mar. 28, 2007 (JP) .............................. 2007-085070

(51) Int. Cl.
*H01S 5/00* (2006.01)

(52) U.S. Cl. .................. 372/49.01; 372/92; 372/99; 372/108

(58) Field of Classification Search .............. 372/49.01, 372/92, 99, 108
See application file for complete search history.

(56) References Cited

U.S. PATENT DOCUMENTS

| | | | | |
|---|---|---|---|---|
| 5,285,468 A | * | 2/1994 | Ackerman et al. | ............ 372/96 |
| 5,497,389 A | * | 3/1996 | Kasukawa et al. | ....... 372/49.01 |
| 5,841,584 A | * | 11/1998 | Takatani et al. | ............. 359/586 |
| 2003/0168667 A1 | | 9/2003 | Shigihara et al. | |
| 2004/0047390 A1 | | 3/2004 | Sverdlov et al. | |
| 2005/0047464 A1 | | 3/2005 | Shigihara et al. | |

FOREIGN PATENT DOCUMENTS

| JP | 5-82897 | 4/1993 |
|---|---|---|
| JP | 9-107156 | 4/1997 |
| JP | 2004-111622 | 4/2004 |
| JP | 2005-72488 | 3/2005 |

OTHER PUBLICATIONS

Hiroo Yonezu, "Optical Communications Device Engineering: Light Emitting Devices And Photodetectors", 3rd edition, Kougakutosho Ltd., pp. 164-169, 242-255 (1984).
"50W 806nm High Power Laser Diode Bar on Microchannel Cooler (BAC50C-806-01, BAC50C-806-02)", Bookham Inc., (2005).

* cited by examiner

*Primary Examiner*—Minsun Harvey
*Assistant Examiner*—Yuanda Zhang
(74) *Attorney, Agent, or Firm*—Leydig, Voit & Mayer, Ltd.

(57) ABSTRACT

A semiconductor laser has a reflectance of the front facet coating film or the rear facet coating film dramatically that decreases at wavelengths greater than a predetermined wavelength. This characteristic causes the loss of the semiconductor laser to dramatically increase at wavelengths greater than the predetermined wavelength. As a result, the oscillation wavelength of the semiconductor laser at high temperatures is clamped to around the predetermined wavelength.

8 Claims, 7 Drawing Sheets

Background Art

SEMICONDUCTOR LASER HAVING FABRY-PEROT RESONATOR

FIELD OF THE INVENTION

The present invention relates to semiconductor lasers having a Fabry-Perot resonator, and more particularly to edge filter type coating layers covering the facets of the resonator.

DESCRIPTION OF THE BACKGROUND ART

Semiconductor lasers having a Fabry-Perot resonator (hereinafter referred to as "FP-LDs") have been known in the art. See, for example, Hiroo Yonezu, "Optical Communications Device Engineering: Light Emitting Devices And Photodetectors," seventh edition, Kougakutosho Ltd., May 20, 2003. This nonpatent document describes the principle of laser oscillation, or lasing, in FP-LDs (pages 164-171). This nonpatent document describes longitudinal mode oscillation in FP-LDs (pages 243-251). The conditions for longitudinal mode oscillation in a FP-LD are determined by the resonator modes that overlap with the gain spectrum peak of the FP-LD, as shown in FIG. 4.2(d) on page 166 of the document. The longitudinal mode spacing of a FP-LD is typically approximately a few angstroms (see page 244 of the above document). This means that in the FP-LD, laser oscillation occurs in the several longitudinal modes that overlap with the gain spectrum peak. The gain spectrum of a FP-LD is determined by the band structure of the semiconductor material of the active layer. Since this band structure changes with temperature, so does longitudinal mode oscillation in the FP-LD. That is to say, the longitudinal mode oscillation has a temperature dependence.

Incidentally, in a FP-LD, coating layers are formed on the emitting facets (i.e., the front and rear facets) of the resonator to protect these facets (see the above nonpatent document). The reflectance Rf of the coating layer on the front facet and the reflectance Rr of the coating layer on the rear facet are set such that the FP-LD has desired characteristics. These reflectances Rf and Rr greatly affect the slope efficiency (SE) of the FP-LD, as can be seen from equation (1) discussed later. Therefore, it is ensured that the coating layers have a robust design to prevent their reflectances Rf, Rr from varying with wavelength. For example, in the case of 0.8 μm LDs for exciting, or pumping, a Nd:YAG laser, which must operate at high power, the reflectances Rf and Rr are usually approximately 10-20% and 95-100%, respectively.

There will now be described the temperature dependence of the oscillation wavelength of a conventional FP-LD in which a coating layer is formed on each facet. In this conventional FP-LD, the reflectance Rf of the coating layer on the front facet is 12% and the reflectance Rr of the coating layer on the rear facet is 99%. These reflectances do not have a temperature dependence. Further, the internal loss αi of the resonator is 1 cm$^{-1}$ and the length Lc of the resonator is 1 mm.

Figure 12:
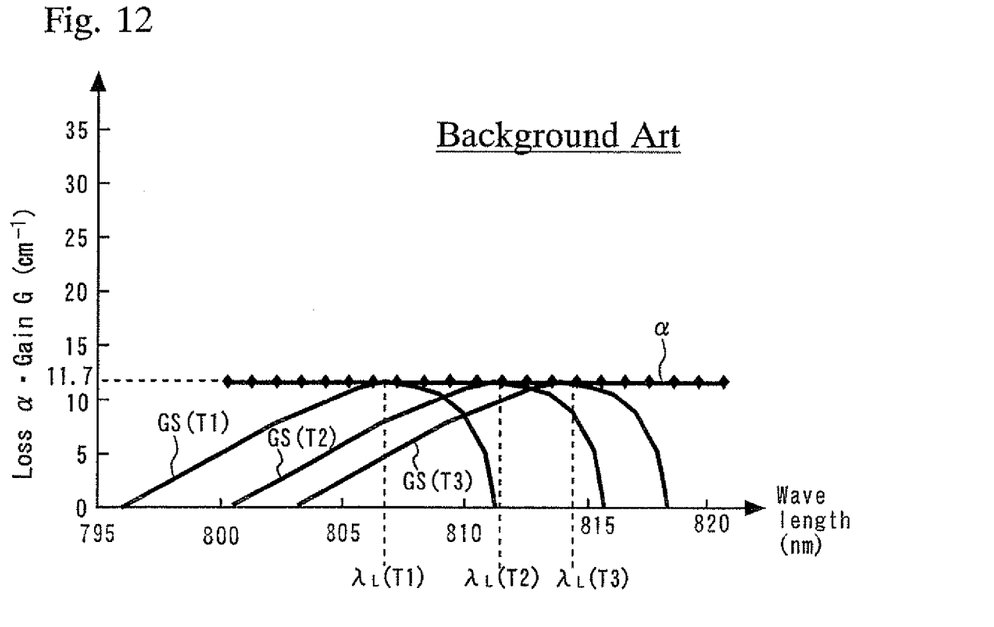
FIG. 12 is a diagram showing that the (overall) loss $\alpha$ of the conventional FP-LD is constant (11.7 cm$^{-1}$) independent of the wavelength of the laser beam.

As shown in FIG. 12, the (overall) loss α of the FP-LD is constant (11.7 cm$^{-1}$) independent of the wavelength of the laser beam. In FIG. 12, symbol "GS(T1)" indicates the gain spectrum of the FP-LD at operating temperature T1 when a current is injected into the FP-LD. In this case, laser oscillation occurs at around wavelength $\lambda_L(T1)$ at which the loss α is balanced by the gain (or gain spectrum peak) in the FP-LD. This oscillation is in a plurality of longitudinal modes whose wavelengths are centered around the wavelength $\lambda_L(T1)$ at which the gain is peaked.

The forbidden band gap of the semiconductor material of the FP-LD decreases as the temperature of the FP-LD increases. In FIG. 12, symbols "GS(T2)" and "GS(T3)" indicate the gain spectra of the FP-LD at operating temperatures T2 and T3, respectively (T1<T2<T3). As shown in FIG. 12, increasing the temperature of the FP-LD results in a shift of its gain spectrum toward longer wavelengths. As a result, the wavelength $\lambda_L$ at which the loss α is balanced by the gain is also shifted toward longer wavelengths, as indicated by symbols "$\lambda_L(T1)$", "$\lambda_L(T2)$", and "$\lambda_L(T3)$" in FIG. 12.

It should be noted that table 4.2 on page 244 of the nonpatent document noted above shows the degrees of temperature dependence of the oscillation wavelengths of conventional FP-LDs. For example, the oscillation wavelength of a 0.8 μm LD formed of AlGaAs material has a temperature dependence of approximately 2-3 angstroms/° C.

Other documents are Japanese Laid-Open Patent Publication Nos. H5-82897 (1993), H9-107156 (1997), 2005-72488, and 2004-111622.

In order to use a FP-LD as an excitation source for a solid laser such as a Nd:YAG or Yb:YAG, it is necessary to accurately control the oscillation wavelength of the FP-LD. Specifically, the oscillation wavelength of the FP-LD must be adjusted to within the range of 805-811 nm, preferably 807-809 nm, when it is applied to the Nd:YAG. On the other hand, the oscillation wavelength must be adjusted to within the range of 931-949 nm, preferably 937-943 nm, when the FP-LD is applied to the Yb:YAG.

It should be noted that the above solid lasers are primarily used for machining, such as welding, cutting, boring, and soldering. Such machining requires high power (a few watts to a few tens of kilowatts), and the (energy) conversion efficiency from the excitation light to the laser light is high (a few tens of percent). This means that exciting a solid laser requires a few to a few hundreds of FP-LDs that deliver a power on the order of a few tens of watts and that have substantially equal oscillation wavelengths. In order to achieve a laser power output on the order of a few tens of watts, a few tens of broad area FP-LDs may be integrated together into a LD bar having a width of 1 cm and mounted on a water-cooled microchannel, as is known in the art. Bookham, Inc. provides such packages (hereinafter called "LD packages"), namely BAC50C-806-01, BAC50C-806-02, etc.

Equalizing the oscillation wavelengths of LD packages requires reducing the variation in the composition and in the thickness of the active layers of the FP-LDs in each LD bar. Further, it is also necessary to reduce the assembly variations of the LD bars and reduce the variation in the thermal resistance of the packages. Further, the temperature of the cooling water for the LD packages must be accurately controlled on the solid laser side, which requires a chiller having a large cooling capacity.

On the other hand, it is desirable to reduce the variation in the oscillation wavelengths of the FP-LDs with variations in the composition and in the thickness of the active layers of the FP-LDs and with variations in the thermal resistance of the packages. That is, it is desirable to reduce the temperature dependence of the oscillation wavelengths of the FP-LDs to improve the yield of the LD packages.

SUMMARY OF THE INVENTION

The present invention has been conceived to solve the previously-mentioned problems and a general object of the present invention is to provide a novel and useful semiconductor laser.

A more specific object of the present invention is to provide a semiconductor laser whose oscillation wavelength has a reduced temperature dependence.

According to one aspect of the present invention, the semiconductor laser comprises a Fabry-Perot resonator. A coating layer is formed on a front facet or a rear facet of the Fabry-Perot resonator. Reflectance of the coating layer decreases at wavelengths longer than a predetermined wavelength.

In the semiconductor laser of the present invention, the coating layer formed on the front or rear facet has reduced reflectance at wavelengths longer than a predetermined wavelength. This means that the loss of the semiconductor laser increases at these wavelengths. As a result, the oscillation wavelength of the semiconductor laser is clamped to around the predetermined wavelength when the temperature of the semiconductor laser is high, thereby reducing the temperature dependence of the oscillation wavelength of the semiconductor laser.

Other objects and further features of the present invention will be apparent from the following detailed description when read in conjunction with the accompanying drawings.

DETAILED DESCRIPTION OF THE PREFERRED EMBODIMENTS

In the following, principles and embodiments of the present invention will be described with reference to the accompanying drawings. The members and steps that are common to some of the drawings are given the same reference numerals and redundant descriptions therefore may be omitted.

Figure 1:
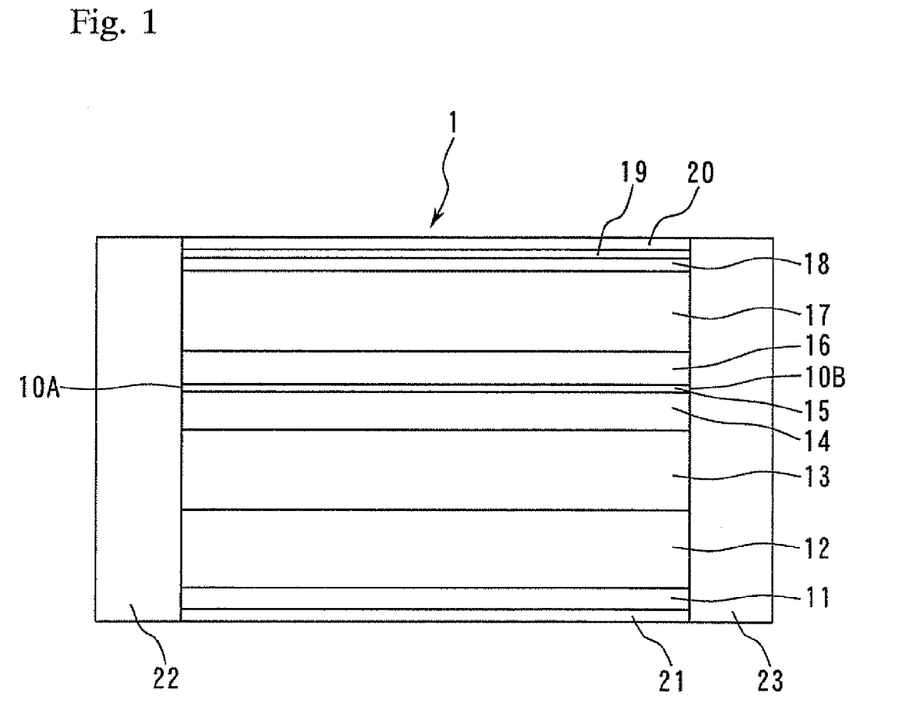
FIG. 1 is a cross-sectional view showing the device structure of a semiconductor laser 1 according to the present invention.

FIG. 1 is a cross-sectional view showing the device structure of a semiconductor laser (hereinafter referred to as a "LD") 1 according to the present invention. The LD 1 includes a Fabry-Perot resonator and oscillates, or lases, at a wavelength around 808 nm. For example, the Fabry-Perot resonator includes the following layers 13-17, and has two mirror facets. The two facets are formed by cleaving, etching and so on.

As shown in FIG. 1, the LD 1 includes a n-type GaAs substrate (or semiconductor substrate) 11. A n-type lower electrode 21 is formed on the bottom surface of the substrate 11. The n-type lower electrode 21 is made up of, for example, a film stack comprising an alloy film of Au and Ge and an Au film.

A n-type buffer layer 12 is formed on the top surface of the substrate 11. The n-type buffer layer 12 is made of, for example, n-type GaAs and has a thickness of, for example, 200-700 nm. A n-type cladding layer 13 is formed on the n-type buffer layer 12. The n-type cladding layer 13 is made of, for example, n-type AlGaInP and has a thickness of, for example, 500-1500 nm. The substrate 11, the n-type buffer layer 12, and the n-type cladding layer 13 are doped with Si (n-type impurities).

A multiquantum well structure is formed on the n-type cladding layer 13. This multiquantum well structure is made up of, for example, an InGaAsP guiding layer 14, a GaAsP active layer 15, and an InGaAsP guiding layer 16. The active layer 15 has a thickness of, for example, 5-12 nm, and the guiding layers 14 and 16 have a thickness of, for example, 500-1500 nm.

A p-type cladding layer 17 is formed on the multiquantum well structure. The p-type cladding layer 17 is made of, for example, p-type AlGaInP and has a thickness of, for example, 500-1500 nm. This layer 17 is doped with Zn or Mg (p-type impurities).

A p-type buffer layer 18 is formed on the p-type cladding layer 17. The p-type buffer layer 18 is made of, for example, p-type Al$_x$Ga$_{1-x}$As and has a thickness of, for example, 100-500 nm. This layer 18 is also doped with Zn or Mg (p-type impurities).

A p-type capping layer 19 is formed on the p-type buffer layer 18 to provide ohmic contact. The p-type capping layer 19 is made of, for example, p-type GaAs and has a thickness of, for example, 1-3 nm. This layer 19 is also doped with Zn or Mg (p-type impurities). A p-type upper electrode 20 is formed on the p-type capping layer 19. The p-type upper electrode 20 is made up of, for example, a film stack comprising a Ti film and an Au film.

The LD 1 has a pair of emitting facets (or cleaved surfaces) 10A and 10B extending parallel to each other. The front emitting facet 10A has formed thereon a coating layer 22 (hereinafter also referred to as the "front facet coating layer 22"). The rear emitting facet 10B, on the other hand, has formed thereon a coating layer 23 (hereinafter also referred to as the "rear facet coating layer 23").

Either the coating layer 22 or 23 is an edge filter type coating layer, which is a coating layer that has reduced reflectance at wavelengths longer or shorter than a predetermined wavelength.

According to first and second embodiments of the present invention (described later), either the reflectance Rf of the front facet coating layer 22 or the reflectance Rr of the rear facet coating layer 23 dramatically decreases at wavelengths longer than a predetermined wavelength.

The coating layers 22 and 23 are each made up of a different multilayer film. These multilayer films are formed of materials selected from the group consisting of oxides (such as silicon oxide, tantalum oxide, aluminum oxide, titanium oxide, and zirconium oxide), nitrides (such as silicon nitride, aluminum nitride, and gallium nitride), and fluorides (such as magnesium fluoride and gallium fluoride).

For a method for designing edge filters, see, e.g., Cheng-Chung Lee, "Optical Thin Films And Coating Technology," Chapter 6, pp. 167-191, translated from Chinese into Japanese by ULVAC, Inc., published by Agne Technical Center. By using the edge filter design method described in this document, those skilled in the art can design the front facet coating layer 22 and the rear facet coating layer 23 such that the reflectance Rf or Rr dramatically decreases at wavelengths longer than a predetermined wavelength.

It should be noted that the (overall) loss $\alpha$ of the LD 1 is expressed by equation (1) below, $$\alpha = \alpha_i + \frac{1}{2Lc} \times \frac{1}{\ln\left(\frac{1}{Rf \times Rr}\right)} \quad (1)$$

where "$\alpha i$" is the internal loss of the LD, "Lc" is the resonator length, "Rf" is the reflectance of the front facet coating layer, and "Rr" is the reflectance of the rear facet coating layer. Further, the second item in the above equation (1) represents the mirror loss.

Laser oscillation occurs (or the lasing threshold is reached) when the loss $\alpha$, expressed by the above equation (1), is balanced by the gain G in the LD 1. The oscillation wavelength ($\lambda_L$) is determined by the several longitudinal modes that overlap with the gain spectrum peak, as described above. That is, laser oscillation occurs at the wavelength $\lambda_L$ determined by these longitudinal modes when the gain G is equal to the loss $\alpha$.

The slope efficiency SE (a primary performance index) of the LD 1 is expressed by equation (2) below. (It should be noted that the slope efficiency SE of a laser is the increase in the optical output power per unit increase in the current after lasing.)

$$SE = \frac{1.24}{\lambda_L} \times \frac{1}{1+\left(\frac{1-Rr}{1-Rf}\right) \times \sqrt{\frac{Rf}{Rr}}} \times \frac{\frac{1}{2Lc} \times \ln\left(\frac{1}{Rf \times Rr}\right)}{\alpha_i + \frac{1}{2Lc} \times \ln\left(\frac{1}{Rf \times Rr}\right)} \times \eta_i \quad (2)$$

where: the oscillation wavelength "$\lambda_L$" is in nm, and "$\eta i$" is the internal quantum efficiency. As can be seen from equation (2), the reflectance "Rf" of the front facet coating layer and the reflectance "Rr" of the rear facet coating layer greatly affect the slope efficiency "SE".

In conventional FP-LDs, the coating layers on the facets have a robust design to prevent their reflectances (Rf, Rr) from varying with wavelength, as described above (see FIG. 12). For example, in the case of 0.8 μm LDs for pumping a Nd:YAG laser, which must operate at high power, the reflectances Rf and Rr are usually approximately 10-20% and 95-100%, respectively.

In the semiconductor lasers of the present invention, on the other hand, the coating layer 22 and the coating layer 23 provided on the front facet 10A and the rear facet 10B, respectively, of the Fabry-Perot resonator are such that either the reflectance Rf of the front facet coating layer 22 or the reflectance Rr of the rear facet coating layer 23 dramatically decreases at wavelengths greater than a predetermined wavelength. This feature will be described in more detail with reference to first and second embodiments of the present invention.

First Embodiment

Figure 2:
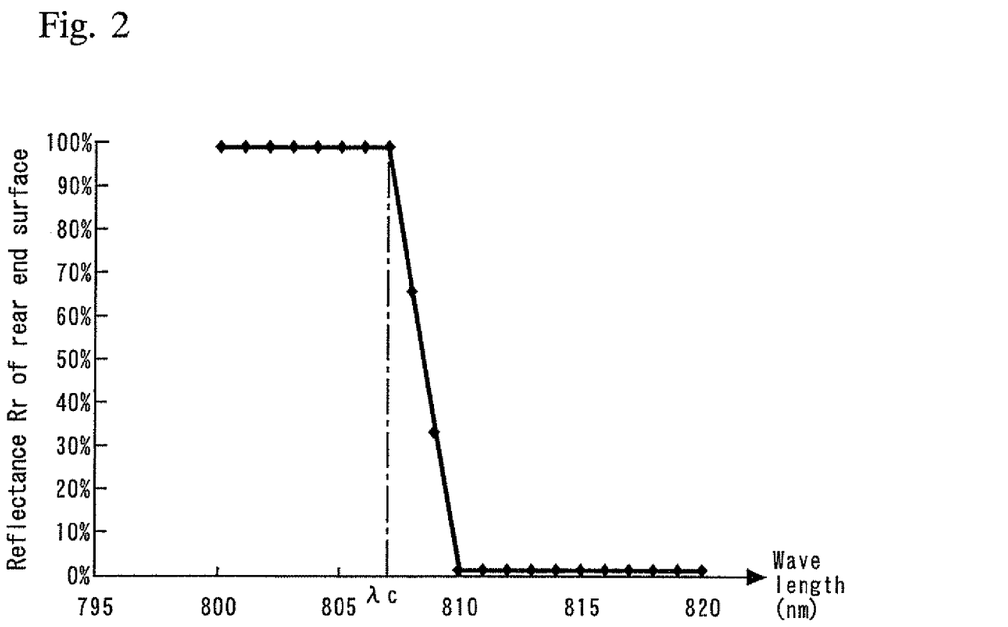
FIG. 2 is a diagram illustrating the wavelength dependence of the reflectance Rr of the rear facet coating layer 23 according to the first embodiment.

According to the first embodiment of the present invention, the reflectance Rr of the rear facet coating layer 23 dramatically decreases at wavelengths greater than a predetermined wavelength $\lambda c$, as shown in FIG. 2. FIG. 2 is a diagram illustrating the wavelength dependence of the reflectance Rr of the rear facet coating layer 23 according to the present embodiment. As shown in FIG. 2, the predetermined wavelength $\lambda c$ is 807 nm, and the reflectance Rr is 99% at wavelengths below the predetermined wavelength $\lambda c$. The reflectance Rr dramatically decreases from 99% to 1% as the wavelength increases from the predetermined wavelength $\lambda c$ (807 nm) to 810 nm (i.e., over a 3 nm wide wavelength range).

The reflectance Rf of the front facet coating film 22, on the other hand, is constant (12%) independent of the wavelength. Further, the resonator length Lc of the LD 1 is 1 mm, and the internal loss $\alpha i$ is 1 cm$^{-1}$.

Figure 3:
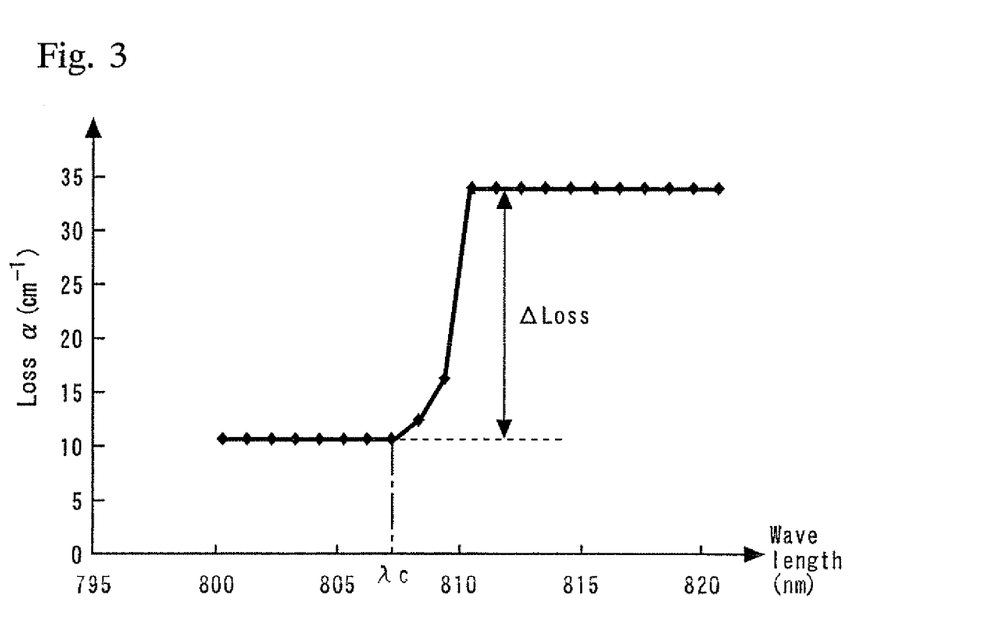
FIG. 3 is a diagram showing the calculation results, illustrating the wavelength dependence of the (overall) loss $\alpha$ of the LD 1 of the first embodiment.

According to the present embodiment, the wavelength dependence of the (overall) loss $\alpha$ of the LD 1 can be calculated from the above equation (1). FIG. 3 shows the calculation results, illustrating the wavelength dependence of the (overall) loss $\alpha$ of the LD 1 of the present embodiment. As shown in FIG. 3, the loss $\alpha$ dramatically increases at wavelengths greater than the predetermined wavelength $\lambda c$. More specifically, the loss $\alpha$ drastically increases as the wavelength increases from the predetermined wavelength $\lambda c$ (807 nm) to 810 nm (i.e., over a 3 nm wide wavelength range). In FIG. 3, the amount of increase in the (overall) loss, that is, the amount of increase in the mirror loss of the resonator, denoted by symbol "$\Delta$Loss", is approximately 23 cm$^{-1}$.

There will now be described the temperature dependence of the oscillation wavelength of the LD 1 in which the loss $\alpha$ has the wavelength dependence as described above.

Figure 4:
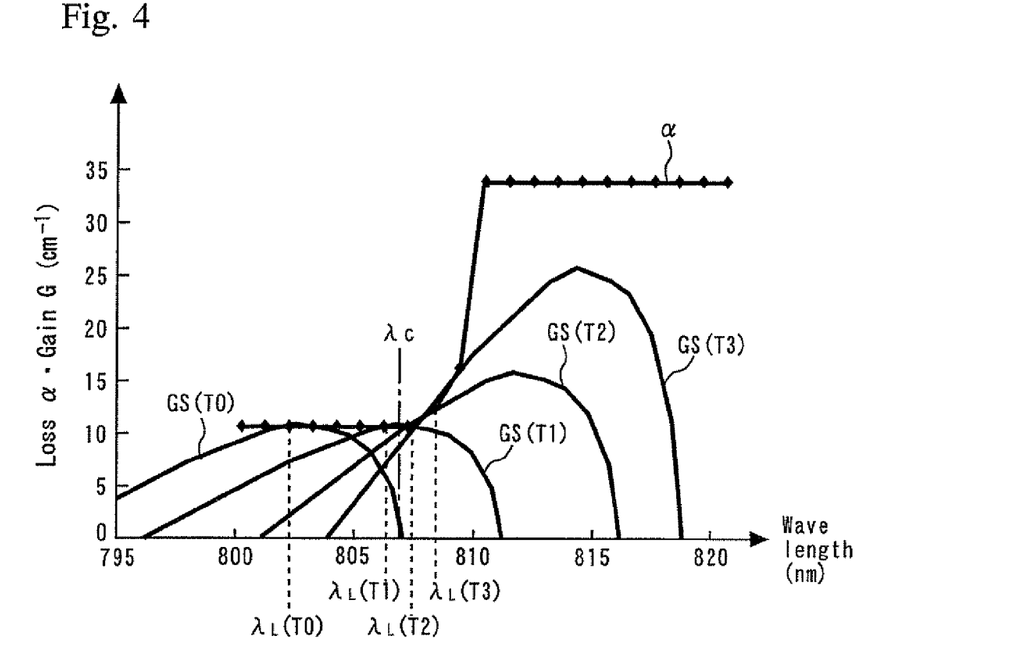
FIG. 4 is a diagram illustrating the temperature dependence of the gain spectrum of the LD 1 of the first embodiment.

FIG. 4 is a diagram illustrating the temperature dependence of the gain spectrum of the LD 1 of the present embodiment. In FIG. 4, symbol "GS(T1)" indicates the gain spectrum of the LD 1 at temperature T1 when a current is injected into the LD 1 (as in FIG. 12 described in connection with a conventional semiconductor laser). Laser oscillation occurs when the loss $\alpha$ is balanced by the gain in the LD 1. This oscillation is in a plurality of longitudinal modes whose wavelengths are centered around the wavelength $\lambda_L$(T1).

The forbidden band gap of the semiconductor material of the LD 1 decreases as the temperature of the LD 1 increases. In FIG. 4, symbols "GS(T2)" and "GS(T3)" indicate the gain spectra of the LD 1 at operating temperatures T2 and T3, respectively (T1<T2<T3). Increasing of the temperature of the LD 1 results in a shift of its gain spectrum (GS) toward longer wavelengths, as shown in FIG. 4.

In the case of the LD 1 of the present embodiment, on the contrary to the conventional LD shown in FIG. 12, the loss $\alpha$ dramatically increases at wavelengths longer than the predetermined wavelength $\lambda c$. Thus, the oscillation wavelength $\lambda_L$ is clamped to around the predetermined wavelength $\lambda c$ even if the temperature of the LD 1 is increased, as shown in FIG. 4. In FIG. 4, symbols "$\lambda_L$(T2)" and "$\lambda_L$(T3)" indicate the oscillation wavelengths of the LD 1 at operating temperatures T2 and T3, respectively.

Figure 5:
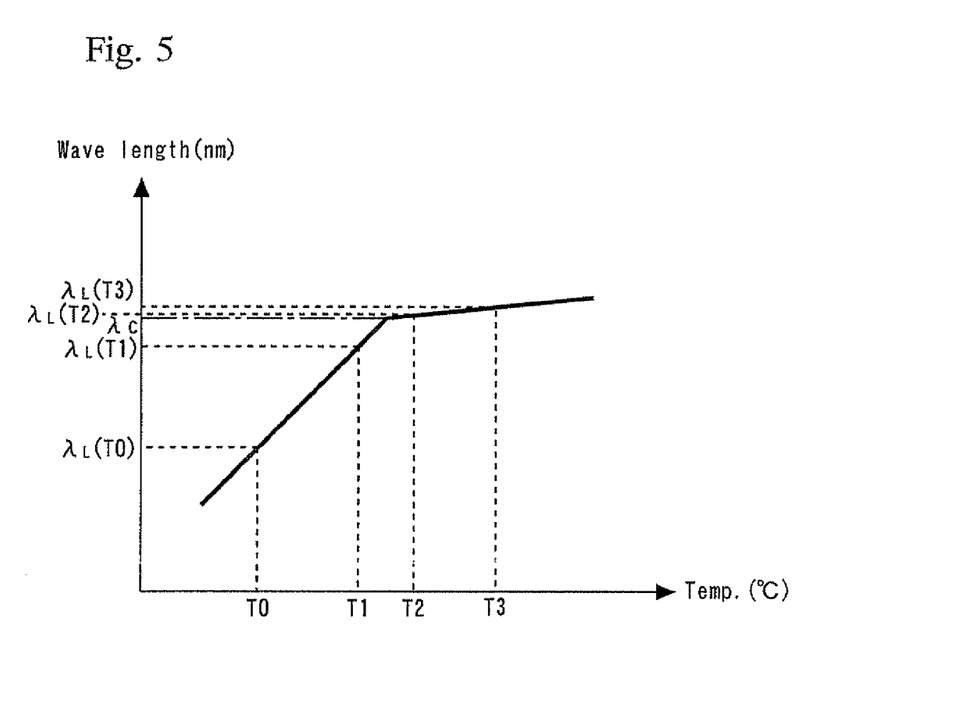
FIG. 5 is a diagram illustrating the temperature dependence of the oscillation wavelength $\lambda_L$ of the LD 1 of the first embodiment.

FIG. 5 is a diagram illustrating the temperature dependence of the oscillation wavelength $\lambda_L$ of the LD 1 of the present embodiment. For example, as the temperature of the LD 1 increases, the oscillation wavelength $\lambda_L$ increases at a rate of 0.26 nm/° C., as in conventional semiconductor lasers, until the predetermined wavelength $\lambda c$ is reached. After that, the oscillation wavelength $\lambda_L$ is substantially clamped to around the predetermined wavelength $\lambda c$ even if the temperature of the LD 1 is further increased, as shown in FIG. 5.

Figure 6:
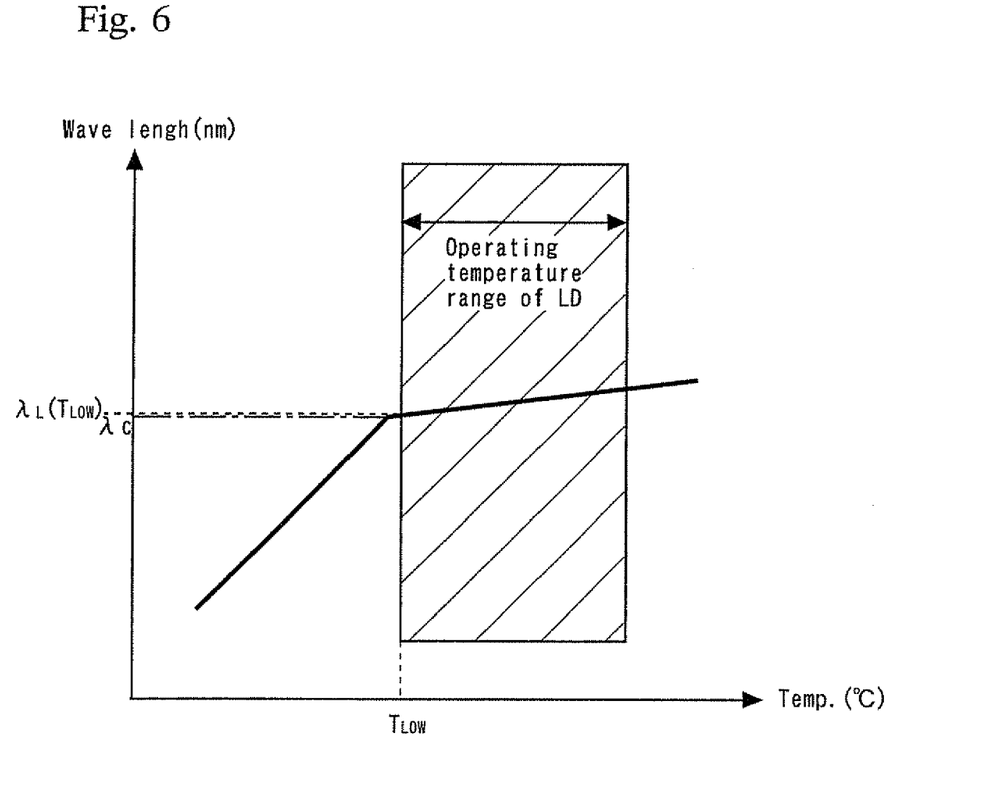
FIG. 6 is a diagram showing the relationship between the operating temperature range of the LD 1 and the predetermined wavelength $\lambda c$ according to the first embodiment.

FIG. 6 shows the relationship between the operating temperature range of the LD 1 and the predetermined wavelength $\lambda c$ according to the present embodiment. In the present embodiment, the predetermined wavelength $\lambda c$ is shorter than the gain peak wavelength $\lambda_L(T_{LOW})$ of the LD 1 at the lowest operating temperature $T_{LOW}$. As a result, the oscillation wavelength $\lambda_L(T_{LOW})$ at the lowest operating temperature $T_{LOW}$ is clamped to around the predetermined wavelength $\lambda c$. This allows the temperature dependence of the oscillation wavelength $\lambda_L$ of the LD 1 to be significantly reduced over the operating temperature range of the LD 1.

According to the present embodiment as described above, the reflectance Rr of the rear facet coating layer 23 dramatically decreases at wavelengths greater than the predetermined wavelength $\lambda c$. As a result, the (overall) loss $\alpha$ of the LD 1 dramatically increases at wavelengths greater than the predetermined wavelength $\lambda c$, as shown in FIG. 3. Therefore, when the LD 1 has a high temperature (such as T2 or T3), the oscillation wavelength $\lambda_L$ at which the loss $\alpha$ is balanced by the gain G is clamped to around the predetermined wavelength $\lambda c$, thus reducing the temperature dependence of the oscillation wavelength $\lambda_L$, as compared to conventional semiconductor lasers.

Further according to the present embodiment, the above predetermined wavelength $\lambda c$ is shorter than the gain peak wavelength $\lambda_L(T_{LOW})$ of the LD 1 at the lowest operating temperature $T_{LOW}$. As a result, the oscillation wavelength $\lambda_L(T_{LOW})$ at the lowest operating temperature $T_{LOW}$ is clamped to around the predetermined wavelength $\lambda c$. This allows the temperature dependence of the oscillation wavelength $\lambda_L$ of the LD 1 to be significantly reduced over the operating temperature range of the LD 1.

In this way it is possible to reduce the variation in the oscillation wavelength $\lambda_L$ of the LD 1 with variations in the composition and in the thickness of the active layer of the LD 1 and with variations in the thermal resistance of the package. Further, a few to a few hundreds of such LDs 1 may be integrated together into a LD package. Such a LD package can be manufactured with increased yield. Further, since the temperature dependence of the oscillation wavelength $\lambda_L$ of the LD 1 is reduced, there is no need to accurately control the temperature of the cooling water for the LD package, making it possible to reduce the size of the chiller installed on the solid laser side.

Second Embodiment

Figure 7:
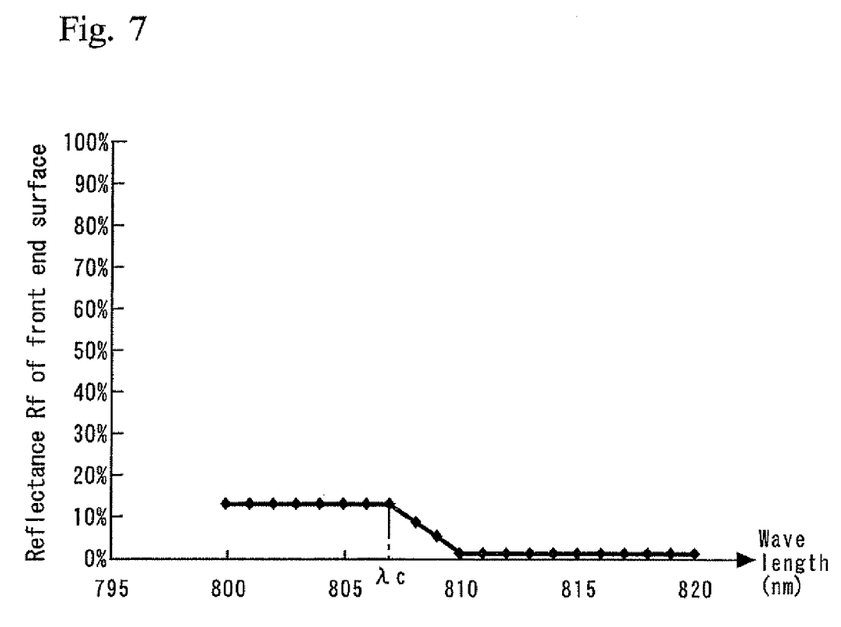
FIG. 7 is a diagram illustrating the wavelength dependence of the reflectance Rf of the front facet coating layer 22 according to the second embodiment.

According to the second embodiment of the present invention, the reflectance Rf of the front facet coating layer 22 dramatically decreases at wavelengths greater than a predetermined wavelength $\lambda c$, as shown in FIG. 7. FIG. 7 is a diagram illustrating the wavelength dependence of the reflectance Rf of the front facet coating layer 22 according to the present embodiment. As shown in FIG. 7, the predetermined wavelength $\lambda c$ is 807 nm, as in the first embodiment. The reflectance Rf is 12% at wavelengths shorter than the predetermined wavelength $\lambda c$. However, the reflectance Rf dramatically decreases from 12% to 0.1% as the wavelength increases from the predetermined wavelength $\lambda c$ (807 nm) to 810 nm (i.e., over a 3 nm wide wavelength range), as shown in FIG. 7.

The reflectance Rr of the rear facet coating layer 23, on the other hand, is constant (99%) independent of wavelength. Further, the resonator length La of the LD 1 is 1 mm, and the internal loss $\alpha i$ is 1 cm$^{-1}$.

Figure 8:
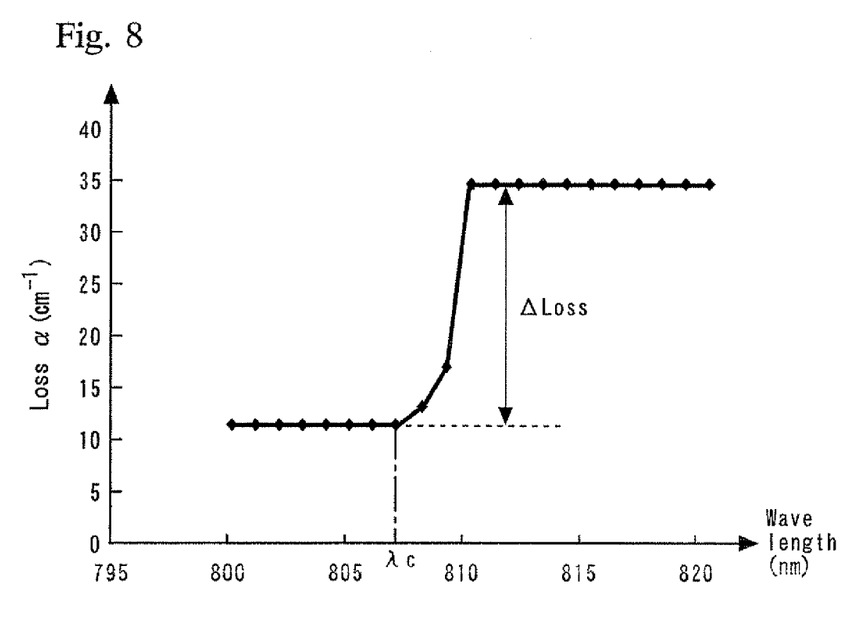
FIG. 8 is a diagram showing the calculation results, illustrating the wavelength dependence of the (overall) loss $\alpha$ of the LD 1 of the second embodiment.

According to the present embodiment, the wavelength dependence of the (overall) loss $\alpha$ of the LD 1 can be calculated from the above equation (1), as in the first embodiment. FIG. 8 shows the calculation results, illustrating the wavelength dependence of the (overall) loss $\alpha$ of the LD 1 of the present embodiment. As shown in FIG. 8, the loss $\alpha$ dramatically increases at wavelengths greater than the predetermined wavelength $\lambda c$. More specifically, the loss $\alpha$ drastically increases as the wavelength increases from the predetermined wavelength $\lambda c$ (807 nm) to 810 nm (i.e., over a 3 nm wide wavelength range). In FIG. 8, the amount of increase in the loss $\alpha$, that is, the amount of increase in the mirror loss of the resonator, denoted by symbol "$\Delta Loss$", is approximately 23 cm$^{-1}$.

There will now be described the temperature dependence of the oscillation wavelength of the LD 1 in which the loss $\alpha$ has the wavelength dependence as described above.

Figure 9:
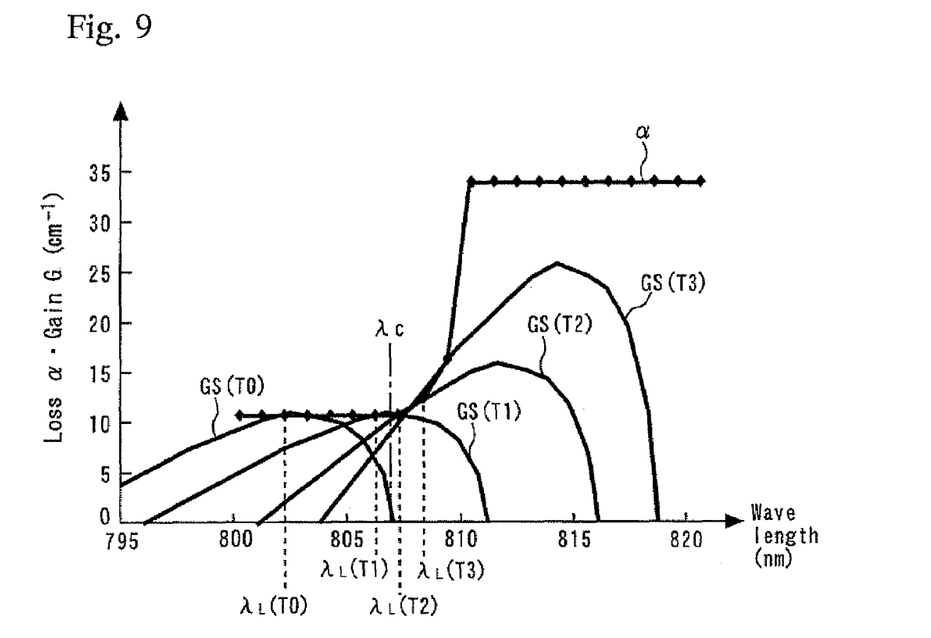
FIG. 9 is a diagram illustrating the temperature dependence of the gain strum of the LD 1 of the second embodiment.

FIG. 9 is a diagram illustrating the temperature dependence of the gain strum of the LD 1 of the present embodiment. In FIG. 9, symbol "GS(T1)" indicates the gain spectrum of the LD 1 at temperature T1 when a current is injected into the LD 1 (as in the first embodiment). Laser oscillation occurs when the loss $\alpha$ is balanced by the gain in the LD 1. This oscillation is in a plurality of longitudinal modes whose wavelengths are centered around the wavelength $\lambda_L(T1)$.

The forbidden band gap of the semiconductor material of the LD 1 decreases as the temperature of the LD 1 increases. In FIG. 9, symbols "GS(T2)" and "GS(T3)" indicate the gain spectra of the LD 1 at operating temperatures T2 and T3, respectively (T1<T2<T3). Increasing of the temperature of the LD 1 results in a shift of its gain spectrum (GS) toward longer wavelengths, as shown in FIG. 9.

In the case of the LD 1 of the present embodiment, on the contrary to the conventional LD shown in FIG. 12, the loss $\alpha$ dramatically increases at wavelengths longer than the predetermined wavelength $\lambda c$. Thus, the oscillation wavelength $\lambda_L$ is clamped to around the predetermined wavelength $\lambda c$ even if the temperature of the LD 1 is increased, as in the first embodiment. In FIG. 9, symbols "$\lambda_L(T2)$" and "$\lambda_L(T3)$" indicate the oscillation wavelengths of the LD 1 at operating temperatures T2 and T3, respectively.

Figure 10:
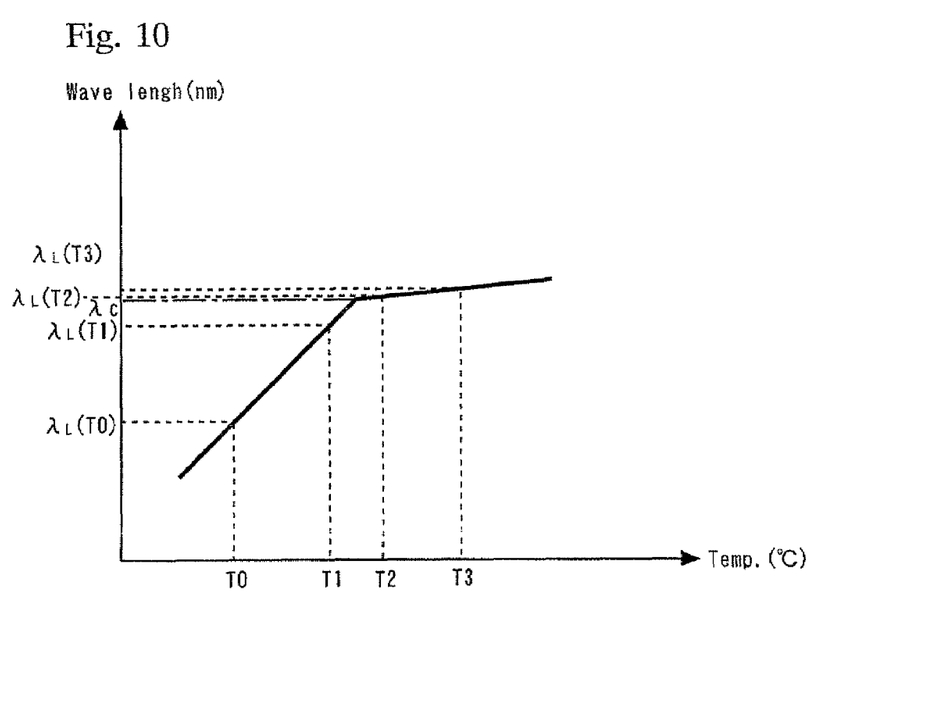
FIG. 10 is a diagram illustrating the temperature dependence of the oscillation wavelength $\lambda_L$ of the LD 1 of the second embodiment.

FIG. 10 is a diagram illustrating the temperature dependence of the oscillation wavelength $\lambda_L$ of the LD 1 of the present embodiment. For example, as the temperature of the LD 1 increases, the oscillation wavelength $\lambda_L$ increases at a rate of 0.26 nm/° C., as in conventional semiconductor lasers, until the predetermined wavelength $\lambda c$ is reached. After that, the oscillation wavelength $\lambda_L$ is substantially clamped to around the predetermined wavelength $\lambda c$ even if the temperature of the LD 1 is further increased, as shown in FIG. 10.

Figure 11:
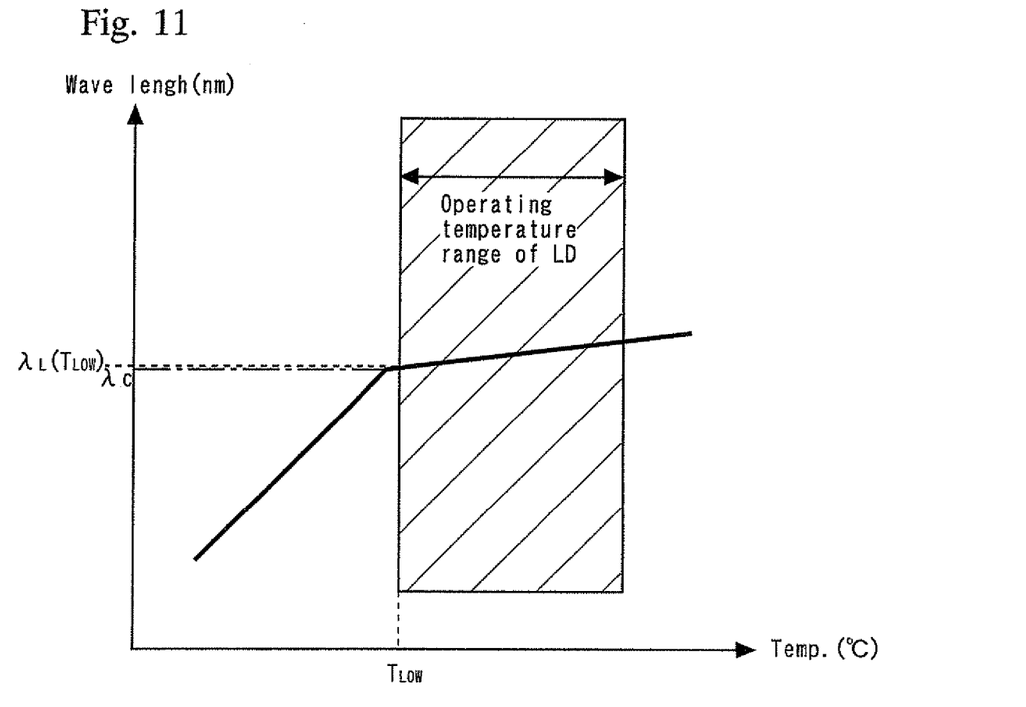
FIG. 11 is a diagram showing the relationship between the operating temperature range of the LD 1 and the predetermined wavelength $\lambda c$ according to the second embodiment.

FIG. 11 shows the relationship between the operating temperature range of the LD 1 and the predetermined wavelength $\lambda c$ according to the present embodiment. In the present embodiment, the predetermined wavelength $\lambda c$ is shorter than the gain peak wavelength $\lambda_L(T_{LOW})$ of the LD 1 at the lowest operating temperature $T_{LOW}$. As a result, the oscillation wavelength $\lambda_L(T_{LOW})$ at the lowest operating temperature $T_{LOW}$ is clamped to around the predetermined wavelength $\lambda c$. This allows the temperature dependence of the oscillation wavelength $\lambda_L$ of the LD 1 to be significantly reduced over the operating temperature range of the LD 1.

According to the present embodiment as described above, the reflectance Rf of the front facet coating layer 22 dramatically decreases at wavelengths greater than the predetermined wavelength λc, As a result, the (overall) loss α of the LD 1 dramatically increases at wavelengths greater than the predetermined wavelength λc, as shown in FIG. 8. Therefore, when the LD 1 has a high temperature (such as T2 or T3), the oscillation wavelength $\lambda_L$ at which the loss α is balanced by the gain G is clamped to around the predetermined wavelength λc, thus reducing the temperature dependence of the oscillation wavelength $\lambda_L$, as compared to conventional semiconductor lasers.

Further according to the present embodiment, the predetermined wavelength λc is shorter than the gain peak wavelength $\lambda_L(T_{LOW})$ of the LD 1 at the lowest operating temperature $T_{LOW}$. As a result, the oscillation wavelength $\lambda_L(T_{LOW})$ at the lowest operating temperature $T_{LOW}$ is clamped to around the predetermined wavelength λc. This allows the temperature dependence of the oscillation wavelength $\lambda_L$ of the LD 1 to be significantly reduced over the operating temperature range of the LD 1.

In this way it is possible to reduce the variation in the oscillation wavelength $\lambda_L$ of the LD 1 with variations in the composition and in the thickness of the active layer of the LD 1 and with variations in the thermal resistance of the package, as in the first embodiment. Further, a few to a few hundreds of such LDs 1 may be integrated together into a LD package. Such a LD package can be manufactured with increased yield. Further, since the temperature dependence of the oscillation wavelength $\lambda_L$ of the LD 1 is reduced, there is no need to accurately control the temperature of the cooling water for the LD package, making it possible to reduce the size of the chiller installed on the solid laser side.

Although the first and second embodiments have been described with reference to FP-LDs having an oscillation wavelength around 808 nm, the present invention can be applied to FP-LDs having any oscillation wavelength or oscillation wavelength band.

Further, the present invention is not limited to LDs formed in AlGaAs, InP, and AlGaInAsP material systems. It can be applied to LDs formed in any suitable material system, e.g., GaN, ZnSe, etc.

Further, the present invention can be applied to LDs having any active layer structure, e.g., a bulk active layer, a single-quantum well active layer, a multiquantum well active layer having a uniform well width, a multiquantum well active layer having a nonuniform well width, a quantum box active layer, etc.

Although in the first and second embodiments the wavelength range over which the reflectance Rf or Rr dramatically increases has a width of 3 nm, in other embodiments it may have a different width determined based on the desired (oscillation) wavelength and the temperature stable region. For example, the wavelength range may have a width of 0.01 nm-10 nm, more preferably 0.01 nm-3 nm. This achieves the same effect as described in connection with the first and second embodiments.

Further, although in the first and second embodiments the mirror loss of the resonator (which is represented by the second item in the above equation (1)) changes by approximately 23 cm$^{-1}$ over the above 3 nm wide wavelength range, in other embodiments the mirror loss may change by a different amount over the same wavelength range. For example, the mirror may change by 15 cm$^{-3}$ or more. This achieves the same effect as described in connection with the first and second embodiments.

Further, the present invention is not limited to these embodiments, but variations and modifications may be made without departing from the scope of the present invention.

The entire disclosure of Japanese Patent Application No. 2007-085070 filed on Mar. 28, 2007 containing specification, claims, drawings and summary are incorporated herein by reference in its entirety.

What is claimed is:

1. A semiconductor laser comprising:
a Fabry-Perot resonator; and
a first coating on a rear facet of the Fabry-Perot resonator, wherein the first coating has a first reflectance, which is substantially constant in a first wavelength range, the first wavelength range extending to a first wavelength from wavelengths shorter than the first wavelength, has a second reflectance that decreases monotonically to a minimum, third reflectance in a second wavelength range, the second wavelength range extending from the first wavelength to a second wavelength that is longer than the first wavelength, and has a third reflectance that is substantially constant at the third reflectance in a third wavelength range, the third wavelength range extending continuously from the second wavelength to wavelengths longer than the second wavelength, wherein the first wavelength is shorter than a wavelength at which gain of the semiconductor laser is maximized when the semiconductor laser operates at a lowest operating temperature.

2. The semiconductor laser according to claim 1, wherein the second wavelength range has a width in a range of 0.01 nm to 10 nm.

3. A semiconductor laser comprising:
a Fabry-Perot resonator; and
a first coating on a rear facet of the Fabry-Perot resonator, wherein the first coating has a first reflectance, which is substantially constant in a first wavelength range, the first wavelength range extending to a first wavelength from wavelengths shorter than the first wavelength, has a second reflectance that decreases monotonically to a minimum, third reflectance in a second wavelength range, the second wavelength range extending from the first wavelength to a second wavelength that is longer than the first wavelength, and has a third reflectance that is substantially constant at the third reflectance in a third wavelength range, the third wavelength range extending continuously from the second wavelength to wavelengths longer than the second wavelength, wherein mirror loss of the Fabry-Perot resonator changes by at least 15 cm$^{-1}$ over the second wavelength range.

4. The semiconductor laser according to claim 1, including a second coating on the front facet of the Fabry-Perot resonator, wherein reflectance of the second coating is substantially constant in the second range.

5. A semiconductor laser comprising:
a Fabry-Perot resonator; and
a first coating on a front facet of the Fabry-Perot resonator, wherein the first coating has a first reflectance, which is substantially constant in a first wavelength range, the first wavelength range extending to a first wavelength from wavelengths shorter than the first wavelength, has a second reflectance that decreases monotonically to a minimum, third reflectance in a second wavelength range, the second wavelength range extending from the first wavelength to a second wavelength that is longer than the first wavelength, and has a third reflectance that is substantially constant at the third reflectance in a third wavelength range, the third wavelength range extending continuously from the second wavelength to wavelengths longer than the second wavelength, wherein mirror loss of the Fabry-Perot resonator changes by at least 15 cm$^{-1}$ over the second wavelength range.

6. The semiconductor laser comprising:

a Fabry-Perot resonator; and a first coating on a rear facet of the Fabry-Perot resonator, wherein the first coating has a first reflectance, which is substantially constant in a first wavelength range, the first wavelength range extending to a first wavelength from wavelengths shorter than the first wavelength, has a second reflectance that decreases monotonically to a minimum, third reflectance in a second wavelength range, the second wavelength range extending from the first wavelength to a second wavelength that is longer than the first wavelength, and has a third reflectance that is substantially constant at the third reflectance in a third wavelength range, the third wavelength range extending continuously from the second wavelength to wavelengths longer than the second wavelength, wherein the first wavelength is shorter than a wavelength at which gain of the semiconductor laser is maximized when the semiconductor laser operates at a lowest operating temperature.

7. The semiconductor laser according to claim 5, wherein the reflectance in the second wavelength range has a width in a range of 0.01 nm to 10 nm.

8. The semiconductor laser according to claim 5, including a second coating on the rear facet of the Fabry-Perot resonator, wherein reflectance of the second coating is substantially constant in the second wavelength range.

* * * * *